United States Patent [19]

Takiguchi

[11] Patent Number: 5,452,383
[45] Date of Patent: Sep. 19, 1995

[54] OPTICAL SWITCH AND METHOD FOR PRODUCING THE OPTICAL SWITCH

[75] Inventor: Tohru Takiguchi, Itami, Japan

[73] Assignee: Mitsubishi Denki Kabushiki Kaisha, Tokyo, Japan

[21] Appl. No.: 188,233

[22] Filed: Jan. 28, 1994

[30] Foreign Application Priority Data

Jun. 30, 1993 [JP] Japan ............................. 5-160629

[51] Int. Cl.$^6$ .................. G02B 6/10; H01L 27/12; H01L 21/70
[52] U.S. Cl. .................................. 385/16; 385/17; 385/18; 385/14; 385/39; 385/40; 385/131; 385/132; 257/15; 257/16; 437/51; 437/110
[58] Field of Search .................. 385/14, 15, 16, 17, 385/24, 39, 40, 41, 42, 129, 130, 131, 132; 437/51, 80, 110, 126, 131, 147; 257/15, 18, 16, 17, 21, 28

[56] References Cited

U.S. PATENT DOCUMENTS

| | | | |
|---|---|---|---|
| 4,840,446 | 6/1989 | Nakamura et al. | 385/132 X |
| 4,861,130 | 8/1989 | Katsuyama et al. | 385/130 X |
| 4,923,264 | 5/1990 | Langer et al. | 385/16 X |
| 5,044,745 | 9/1991 | Inoue et al. | 385/16 |
| 5,091,980 | 2/1992 | Ogawa et al. | 385/132 X |
| 5,247,592 | 9/1993 | Inoue et al. | 385/16 |
| 5,306,924 | 4/1994 | Usami et al. | 257/18 |
| 5,339,370 | 8/1994 | Sano et al. | 385/131 X |

FOREIGN PATENT DOCUMENTS

| | | | |
|---|---|---|---|
| 60-252329 | 12/1985 | Japan | 385/16 X |
| 1283526 | 11/1989 | Japan | 385/16 X |

OTHER PUBLICATIONS

Inoue et al, "Carrier-Injection Type Optical S$^3$ Switch With Traveling-Wave Amplifier", IEEE Photonics Technology Letters, vol. 2, No. 3, Mar. 1990, pp. 214–215.

Inoue et al, "An 8mm Length Nonblocking 4×4 Optical Switch Array", IEEE Journal on Selected Areas in Communications, vol. 6, No. 7, Aug. 1988, pp. 1262–1266.

Primary Examiner—Brian Healy
Attorney, Agent, or Firm—Leydig, Voit & Mayer

[57] ABSTRACT

An optical switch includes a semiconductor substrate having a surface, a ridge waveguide disposed on the surface of the semiconductor substrate and including an optical waveguide layer having an MQW structure, first and second cladding layers sandwiching the optical waveguide layer, and a switch disposed in a part of the ridge waveguide. A part of the MQW optical waveguide layer included in the switch is thicker than the other part of the optical waveguide layer, whereby the energy band gap of the optical waveguide layer of the switch is smaller than the energy band gap of the other part of the optical waveguide layer and larger than the energy of the signal light. Therefore, the absorption loss of the signal light traveling through the optical waveguide layer is reduced. Furthermore, since the variation in the refractive index of the switch when current is applied to the switch is increased, the ON/OFF ratio of the switch is increased.

9 Claims, 19 Drawing Sheets

OPTICAL SWITCH AND METHOD FOR PRODUCING THE OPTICAL SWITCH

FIELD OF THE INVENTION

The present invention relates to an optical switch including a waveguide for transmitting signal light and a switch disposed in a part of the waveguide for switching the course of the signal light and, more particularly, to a switch that offers less absorption loss of the signal light traveling through the wave guide and a high ON/OFF ratio.

BACKGROUND OF THE INVENTION

FIG. 18 is a perspective view schematically illustrating a prior art optical switch disclosed in IEEE PHOTONICS TECHNOLOGY LETTERS, Vol.2, No.3, pp.214–215, 1990, and FIG. 19 is a plan view thereof. In these figures, reference numeral 180 designates an optical switch. Reference numeral 1 designates an n type InP substrate having opposite front and rear surfaces. An InGaAsP optical waveguide layer 23 including ridge waveguide parts 2a to 2c is disposed on the front surface of the substrate 1. The InGaAsP optical waveguide layer 23 has an energy band gap corresponding to a wavelength of 1.15 $\mu$m. This optical switch includes two Y-branch switch parts 3a and 3b and an optical amplifier 17. More specifically, the switch 3a is disposed in a part of the ridge waveguide 2a in the vicinity of the junction between the ridge waveguides 2a and 2b, and the switch 3b is disposed in a part of the ridge waveguide 2c in the vicinity of the junction between the ridge waveguides 2c and 2b. The optical amplifier 17 is disposed in a part of the ridge waveguide 2b. In addition, reference numerals 4 to 6 designate signal lights, and reference numeral 8 designates electrodes of the switches 3a and 3b and the optical amplifier 17.

FIGS. 20, 21, and 22 are sectional views taken along lines 20–20, 21–21, and 22–22 of FIG. 19 illustrating internal structures of the waveguide 2c, the switch 3a, and the amplifier 17, respectively. The internal structures of the waveguides 2a and 2b are the same as that of the waveguide 2c shown in FIG. 20, and the internal structure of the switch 3b is the same as that of the switch 3a show in FIG. 21.

The internal structures of the respective parts will be described in more detail using FIGS. 20 to 22.

In FIG. 20, the InGaAsP optical waveguide layer 12 having a ridge is disposed on the n type InP substrate 1. A p type InP cladding layer 9 is disposed on the ridge of the waveguide layer 12. An InGaAsP cap layer 10 is disposed on the cladding layer 9. The ridge of the waveguide layer 12, the cladding layer 9, and the cap layer 10 are of the same width. The exposed portions of the waveguide layer 12, the cladding layer 9, and the cap layer 10 are completely covered with an insulating film 11 comprising SiO$_2$.

As shown in FIG. 21, the optical switch 3a further includes an electrode 8 of a prescribed width disposed on a part of the InGaAsP cap layer 10. The surface of the semiconductor structure where the electrode 8 is absent is covered with the insulating film 11.

As shown in FIG. 22, the optical amplifier 17 further includes an InP etching stopper layer 14 and an InGaAsP active layer 13 having an energy band gap corresponding to a wavelength of 1.3 $\mu$m, which are interposed between the InGaAsP waveguide layer 12 and the p type InP cladding layer 9.

A description is given of the operation.

First of all, the operation of the switches 3a and 3b will be described. When current is injected from the electrodes 8 of the switches 3a and 3b, the refractive index of the InGaAsP optical waveguide layer 12 in the switch region is reduced due to the plasma effect and the band-filling effect, resulting in a difference in refractive indices between part of the InGaAsP optical waveguide layer 12 included in the switches 3a and 3b to which current is applied and the other part of the InGaAsP optical waveguide layer 12 to which no current is applied. Therefore, the signal light traveling through the waveguide 2a in the direction indicated by the arrow 4 is reflected by the switch 3a and turned to the waveguide 2b due to the above-described difference in the refractive indices. Then, the signal light traveling through the waveguide 2b is reflected by the switch 3b and the reflected light travels through the waveguide 2c (signal light 6). On the other hand, when no current is applied to the switches 3a and 3b, since there is no difference in indices between the switches 3a and 3b and the waveguides 2a and 2c, the signal light 4 is not reflected by the switch 3a but travels straight in the waveguide 2a (signal light 5).

Next, amplification of signal light will be described.

Generally, the intensity of signal light is reduced with an increase in the absorption loss when traveling through the waveguide. In the optical amplifier 7, when current is injected from the electrode 8, signal light passing through this region is amplified by the gain mechanism like that in the operation of a semiconductor laser. Therefore, the intensity of the signal light, which is reduced due to the absorption loss in the waveguide, can be increased again by the optical amplifier 7.

In the above-described optical switch, however, since the switches 3a and 3b and the waveguides 2a to 2c comprise the same semiconductor layers of the same energy band gaps, the variation in the refractive index of the switch at the time of current injection is small, i.e., the ON/OFF ratio of the switch is small, so that the signal light cannot be reflected with high efficiency.

Further, although the optical amplifier disposed in the waveguide compensates for the absorption loss of the signal light traveling through the waveguide, the degree of the amplification is not very high, and the intensity of the signal light cannot be maintained at a high level with high stability.

Meanwhile, Japanese Published Patent Application No. Sho. 60-252329 proposes an optical switch in which a switch part comprises a multiquantum well layer (hereinafter referred to as MQW layer) to increase the ON/OFF ratio of the switch part. In this prior art, however, since the switch part and the waveguide are produced in different process steps, the production process is complicated. In addition, since the switch part and the waveguide include different optical waveguide layers of different semiconductor materials, the transmission loss of signal light at the boundary between the switch part and the waveguide is large, so that the intensity of the signal light cannot be maintained with high stability.

Japanese Published Patent Application No. Hei. 1-283526 proposes an optical switch in which upper and lower cladding layers sandwiching a switch part comprise MQW layers to increase the ON/OFF ratio of the switch part. In this optical switch, differently from the above-described optical switch disclosed in the publication No. Sho. 60-252329, the switch part and the waveguide include the same optical waveguide layer like the optical switch shown in FIGS. 18 and 19, so that the above-described transmission loss of the signal light is avoided. However, since the upper and lower cladding layers sandwiching the switch part are MQW layers, the variation in the refractive index at the switch part is small, and the ON/OFF ratio of the switch part cannot be increased to a desired level.

SUMMARY OF THE INVENTION

It is an object of the present invention to provide an optical switch with a high ON/OFF ratio, no transmission loss of signal light at the boundary between the switch part and a waveguide, and reduced absorption loss of the signal light traveling through the waveguide.

It is another object of the present invention to provide a method for producing the optical switch.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, an optical switch comprises a semiconductor substrate having a surface, a ridge waveguide disposed on the surface of the semiconductor substrate and including at least an optical waveguide layer of MQW structure and first and second cladding layers sandwiching the optical waveguide layer, and a switch disposed in a prescribed part of the ridge waveguide. A part of the MQW optical waveguide layer included in the switch is thicker than the other part of the optical waveguide layer, whereby the energy band gap of the optical waveguide layer of the switch is smaller than the energy band gap of the other part of the optical waveguide layer and larger than the energy of said signal light. Therefore, the absorption loss of the signal light traveling through the optical waveguide layer is reduced, and a reduction in the intensity of the signal light is suppressed. Furthermore, since the variation in the refractive index of the switch when current is applied to the switch is increased, the ON/OFF ratio of the switch can be increased.

According to a second aspect of the present invention, the above-described optical switch further includes an optical amplifier disposed in a part of the ridge waveguide. A part of the MQW optical waveguide layer included in the optical amplifier is thicker than the part of the MQW optical waveguide layer included in the switch so that the energy band gap of the optical amplifier is smaller than the energy of the signal light. Therefore, the optical amplifier amplifies the signal light with high efficiency and compensates for the absorption loss of the signal light traveling through the optical waveguide layer.

According to a third aspect of the present invention, the above-described optical switch further includes an optical absorption part disposed in a part of the ridge waveguide on the lower side of the switch in the signal light traveling direction. The energy band gap of the optical absorption part is the same as that of the switch. Therefore, a part of the signal light that is not reflected at the switch but crosses the switch is absorbed by the optical absorption part, whereby unwanted transmission of signal light in the waveguide layer can be reduced.

According to a fourth aspect of the present invention, in a method for producing an optical switch, a region on a semiconductor substrate where a switch is to be formed is sandwiched with spaced apart first mask patterns, and semiconductor layers including an MQW layer are epitaxially grown on the substrate so that the energy band gap of the MQW layer grown on the region where the switch is to be formed is smaller than the energy band gap of the MQW layer grown on the other region and larger than the energy of the signal light. Thereafter, the epitaxially grown layers are patterned to attain a prescribed ridge waveguide. Therefore, an optical switch with less reduction in the intensity of the signal light and an increased ON/OFF ratio is produced in a simple process.

According to a fifth aspect of the present invention, in the above-described method for producing an optical switch, a region on the semiconductor substrate where an optical amplifier is to be formed is sandwiched with spaced apart second mask patterns. The space between the second mask patterns is narrower than the space between the above-described first mask patterns. Thereafter, the semiconductor layers including the MQW layer are epitaxially grown on the substrate. Therefore, an optical switch including a switch and an optical amplifier that amplifies signal light of reduced intensity with high efficiency is produced in a simple process.

According to a sixth aspect of the present invention, in the above-described method for producing an optical switch, a region on the semiconductor substrate where an optical absorption part is to be formed is sandwiched with spaced apart third mask patterns. The space between the third mask patterns is the same as the space between the first mask patterns. Thereafter, the semiconductor layers including the MQW layer are epitaxially grown on the substrate. Therefore, an optical switch including an switch and an optical absorption part that absorbs unwanted signal light passing through the switch is produced in a simple process.

DETAILED DESCRIPTION OF THE PREFERRED EMBODIMENTS

Figure 1:
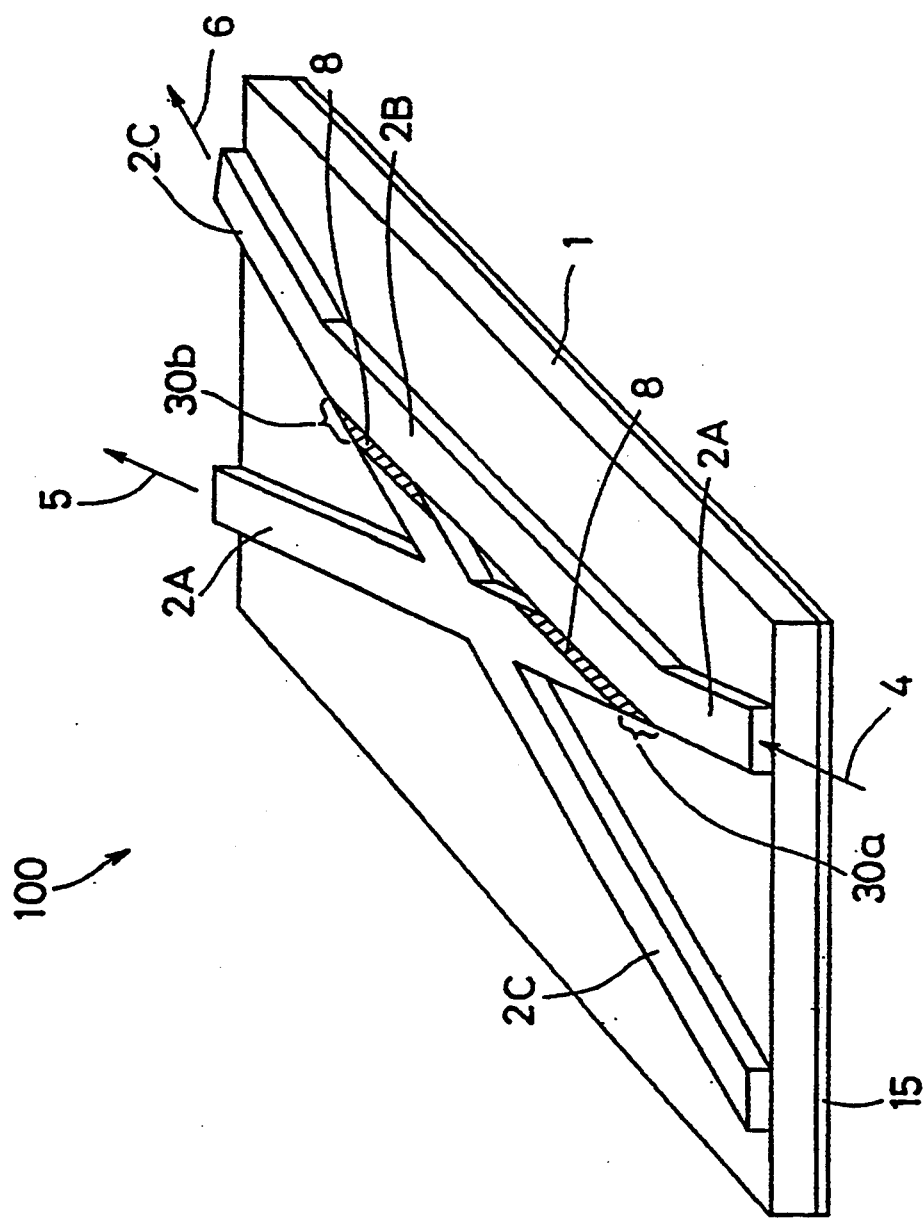
FIG. 1 is a perspective view illustrating an optical switch in accordance with a first embodiment of the present invention.
Figure 2:
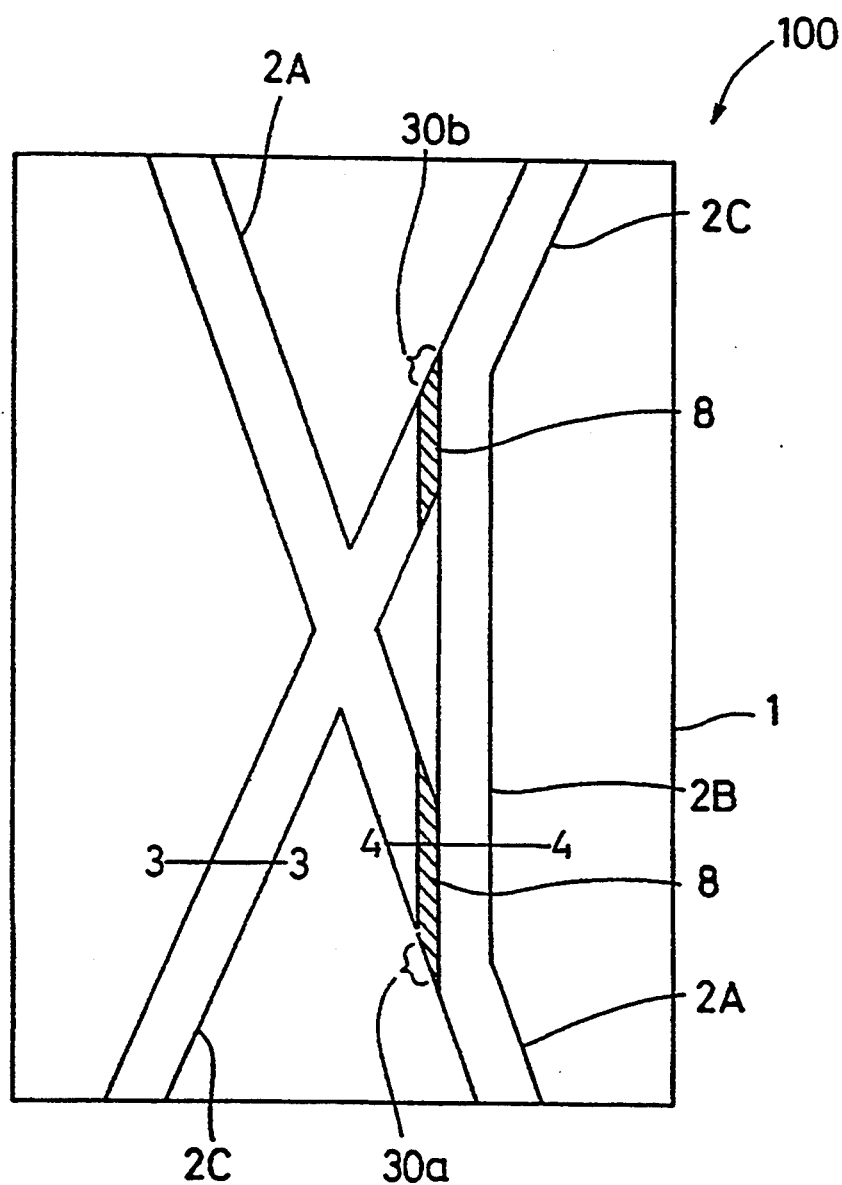
FIG. 2 is a plan view of the optical switch shown in FIG. 1.
Figure 18:
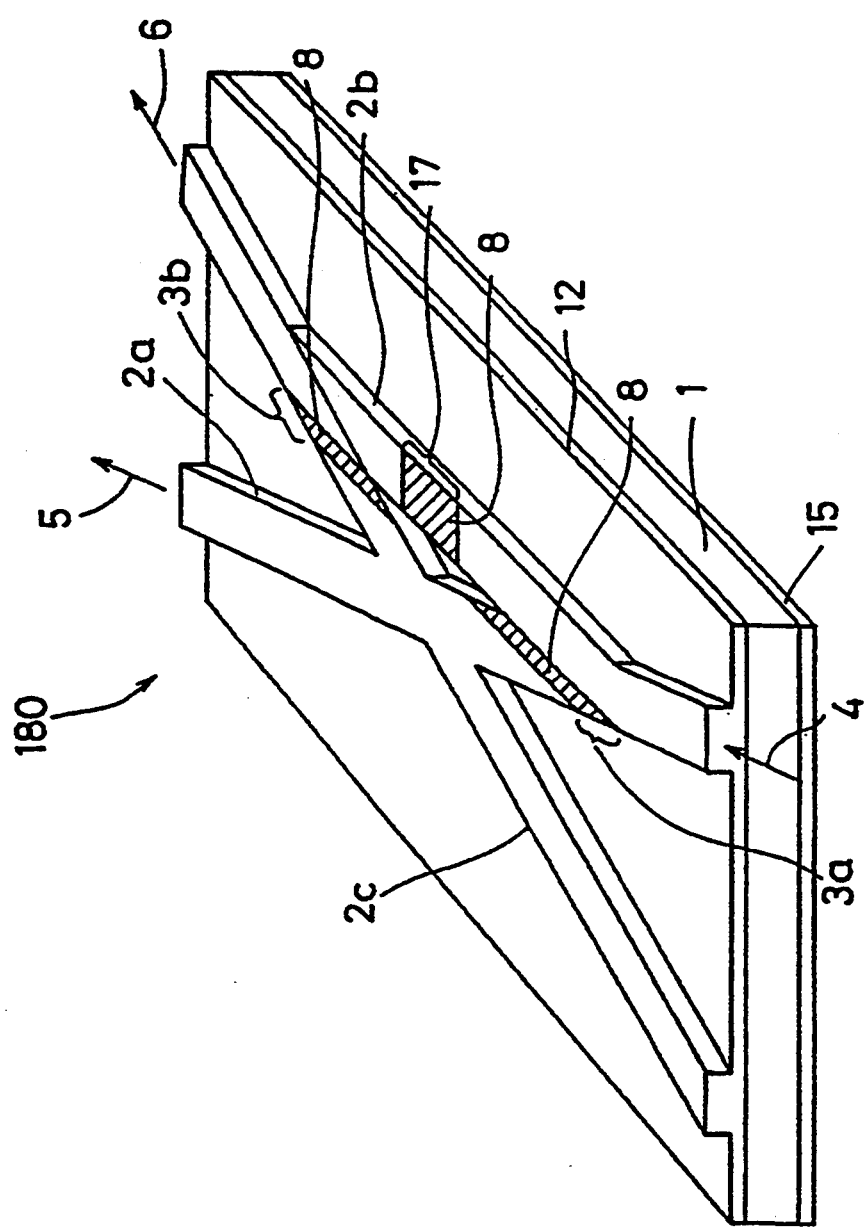
FIG. 18 is a perspective view of an optical switch in accordance with the prior art.
Figure 19:
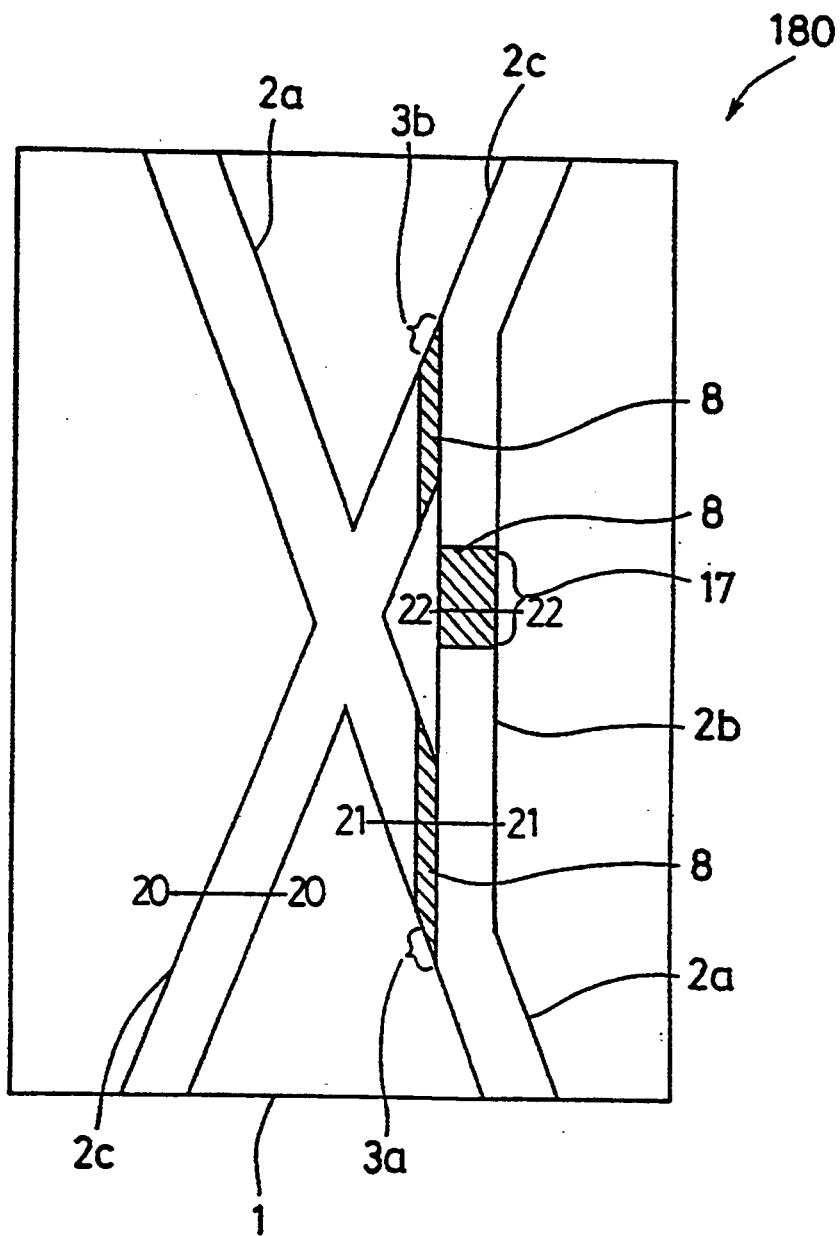
FIG. 19 is a plan view of the optical switch of FIG. 18.
Figure 20:
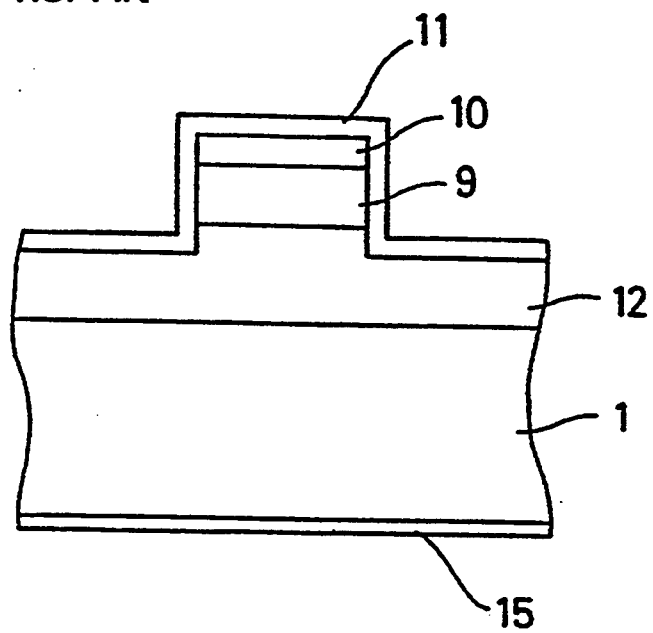
FIG. 20 is a sectional view taken along line 20—20 of FIG. 19.
Figure 21:
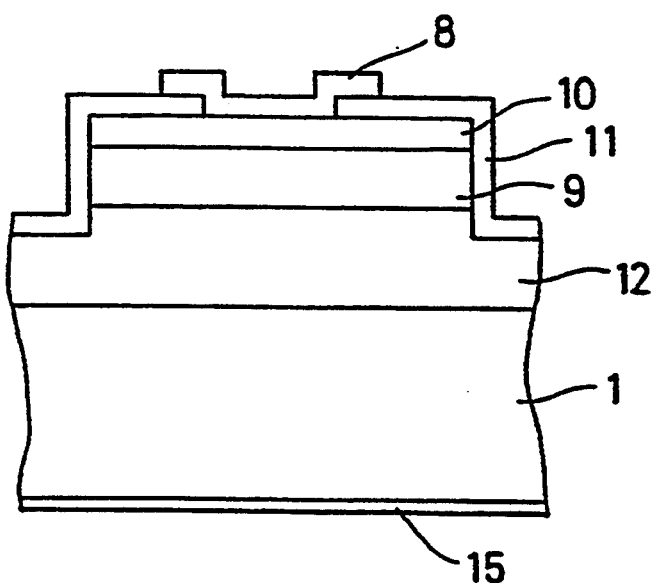
FIG. 21 is a sectional view taken along line 21—21 of FIG. 19.
Figure 22:
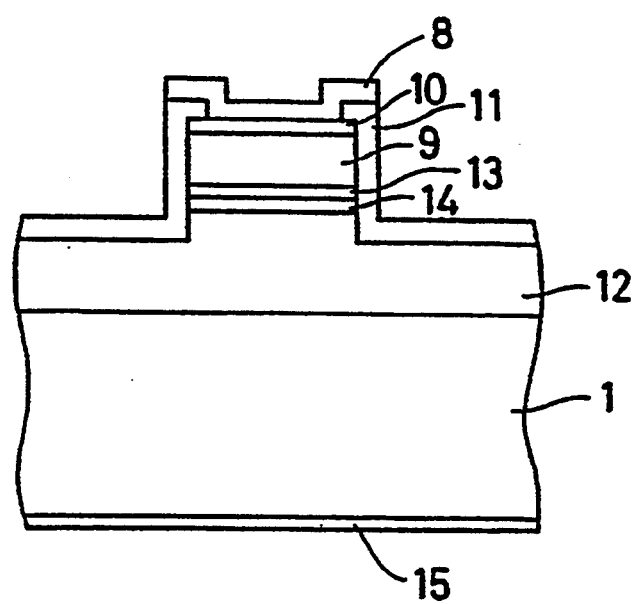
FIG. 22 is a sectional view taken along line 22—22 of FIG. 19.

FIGS. 1 and 2 are a perspective view and a plan view, respectively, schematically illustrating an optical switch in which signal light having an energy of 0.95 eV corresponding to a wavelength of 1.3 μm travels, all in accordance with a first embodiment of the present invention. In the figures, the same reference numerals as in FIGS. 18 and 19 designate the same or corresponding parts. Reference numeral 100 designates an optical switch. The optical switch 100 comprises an n type InP substrate 1, an electrode 13 comprising Cr/Au disposed on the rear surface of the substrate 1, ridge waveguides 2A, 2B, and 2C disposed on the front surface of the substrate 1, and two switches 30a and 30b. The switch 30a is disposed in a part of the ridge waveguide 2A in the vicinity of the junction between the ridge waveguides 2A and 2B, and the switch 30b is disposed in a part of the ridge waveguide 2C in the vicinity of the junction between the ridge waveguides 2C and 2B. In addition, reference numerals 4, 5, and to 6 designate signal lights, and reference numeral 8 designates electrodes of the switches 30a and 30b. Preferably, these electrodes comprise Au/Zn/Ni.

Figure 3:
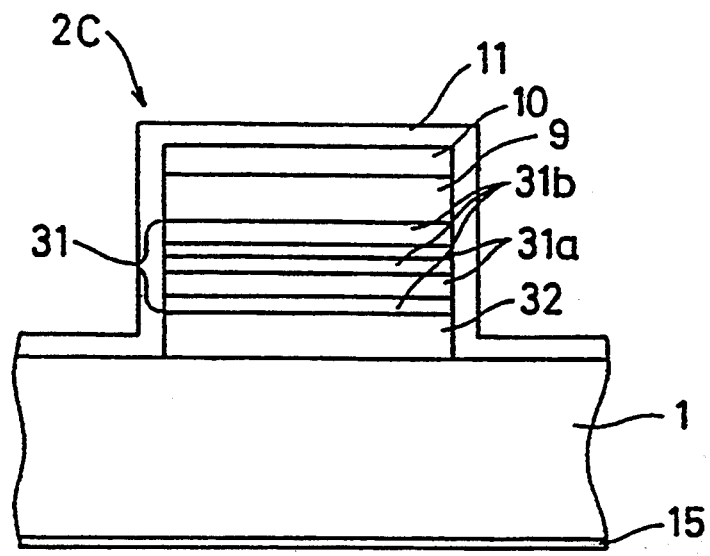
FIG. 3 is a sectional view taken along line 3—3 of FIG. 2.

FIG. 3 is a sectional view taken along line 3—3 of FIG. 2 illustrating the internal structure of the waveguide 2C of the optical switch 100. Internal structures of the waveguides 2A and 2B are identical to that shown in FIG. 3. In FIG. 3, the ridge waveguide 2C comprises an n type InP lower cladding layer 32 disposed on the n type InP substrate 1, an optical waveguide layer 31 having an MQW structure disposed on the lower cladding layer 32, a p type InP upper cladding layer 9 disposed on the waveguide layer 31, and a p type InGaAsP contact layer 10 disposed on the upper cladding layer 9. The ridge waveguide 2C and the surface of the substrate 1 where the waveguide 2C is absent are completely covered with an SiO$_2$ insulating film 11. The optical waveguide layer 31 comprises two In$_{0.68}$Ga$_{0.32}$As$_{0.70}$P$_{0.30}$ well layers 31a each having a thickness of 10 Å and three InP or In$_{0.85}$Ga$_{0.15}$As$_{0.32}$P$_{0.68}$ barrier layers 31b each having a thickness of 70 Å which are alternatingly laminated. The energy band gap of the optical waveguide layer 31 is 1.05 eV which corresponds to a wavelength of 1.18 μm.

Figure 4:
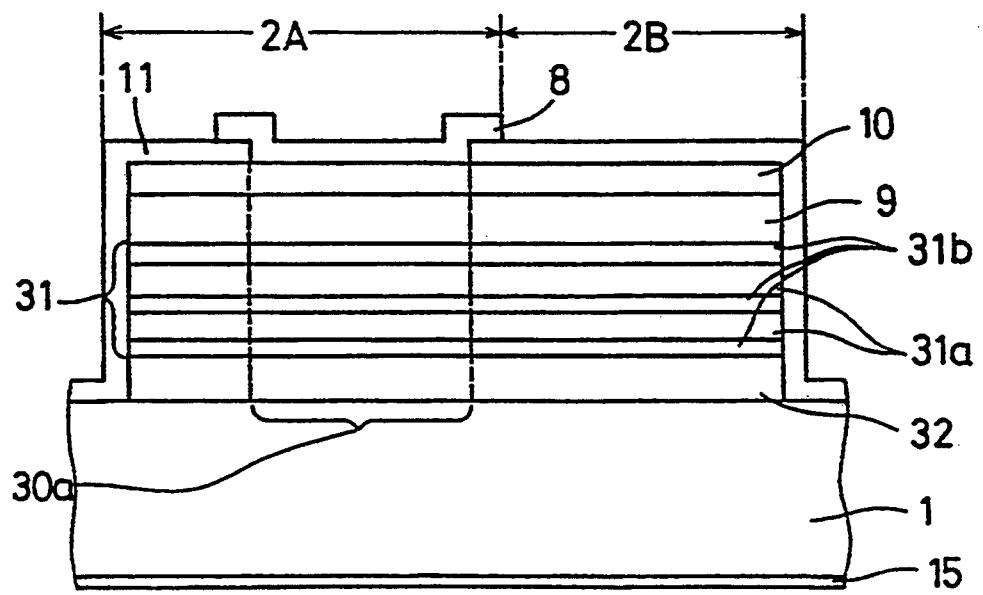
FIG. 4 is a sectional view taken along line 4—4 of FIG. 2.

FIG. 4 is a sectional view taken along line 4—4 of FIG. 2, illustrating the internal structure of a part of the optical switch where the waveguide 2A including the switch 30a and the waveguide 2B are connected. The internal structure of a part where the waveguide 2B and the waveguide 2C including the switch 30b are connected is identical to that shown in FIG. 3. In FIG. 4, the waveguides 2A and 2B comprise an n type InP cladding layer 32 disposed on the n type InP substrate 1, an optical waveguide layer 31' having an MQW structure disposed on the cladding layer 32, a p type InP cladding layer 9 disposed on the waveguide layer 31', and a p type InGaAsP contact layer 10 disposed on the cladding layer 9. An electrode 8 is disposed on a part of the p type InGaAsP contact layer 10 of the waveguide 2A, and the electrode 8 and a part of the waveguide 2A opposite the electrode 8 serve as the switch 30a. The surface of the contact layer 10 where the electrode 8 is absent, the side surfaces of the ridge waveguides 2A and 2B, and the surface of the substrate 1 where the waveguides 2A and 2B are absent are covered with an SiO$_2$ insulating film 11. The optical waveguide layer 31' having an MQW structure comprises two InGaAsP well layers 31a', each having a thickness of 70 Å, and three InP or InGaAsP barrier layers 31b', each having a thickness of 300 Å, which are alternatingly laminated. The energy band gap of the optical waveguide layer 31' is 0.98 eV which corresponds to a wavelength of 1.27 μm. That is, the thicknesses of the well layer 31a' and the barrier layer 31b' are larger than the thicknesses of the well layer 31a and the barrier layer 31b, respectively, and the energy band gap of the optical waveguide layer 31' is smaller than the energy band gap of the optical waveguide layer 31.

A description is given of the operation.

Figure 5:
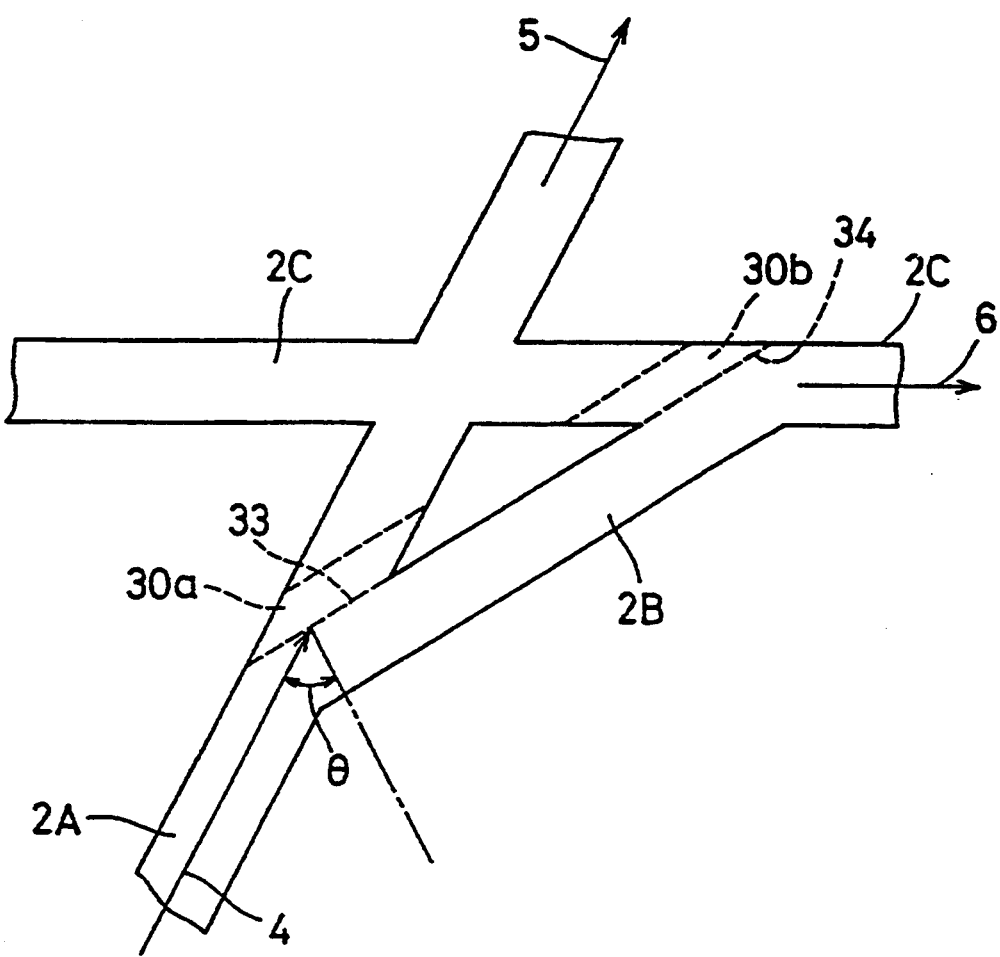
FIG. 5 is a schematic diagram for explaining the course of signal light traveling through waveguides 2A, 2B, and 2C of the optical switch shown in FIGS. 1 and 2.

FIG. 5 is a schematic diagram illustrating the course of signal light in the waveguides 2A, 2B, and 2C. In the figure, the same reference numerals as in FIGS. 1 and 2 designate the same or corresponding parts. Reference numeral 33 designates a boundary between the switch 30a and the waveguide 2B, and reference numeral 34 designates a boundary between the switch 30b and the waveguide 2B. Reference character θ designates an incident angle of the signal light 4 on the switch 30a, i.e., the boundary 33.

When current is injected into the switch 30a (30b) from the electrode 8, the refractive index of the optical waveguide layer 31' in the current injected region decreases, and the refractive index of the optical waveguide layer 31' included in the switch 30a (30b) differs from the refractive index of the optical waveguide layer 31' in the vicinity of the switch 30a (30b) where no current is injected and from the optical waveguide layer 31 of the waveguides 2A and 2C. Therefore, in FIG. 5, signal light 4 traveling through the optical waveguide layer 31 of the waveguide 2A is reflected by the boundary 33 and turned to the waveguide 2B. Then, the signal light travels through the waveguide 2B and is reflected by the boundary 34, and the reflected light travels through the waveguide 2C (signal light 6). On the other hand, when no current is injected into the semiconductor layers of the switch 30a, the signal light 4 crosses the switch 30a and travels straight in the waveguide 2A (signal light 5). As the reflectance of the signal light at the boundary 33 (34) between the switch 30a (30b) and the waveguide is increased, the switching characteristics of the switch are improved, i.e., the ON/OFF ratio of the switch is increased.

Figure 6:
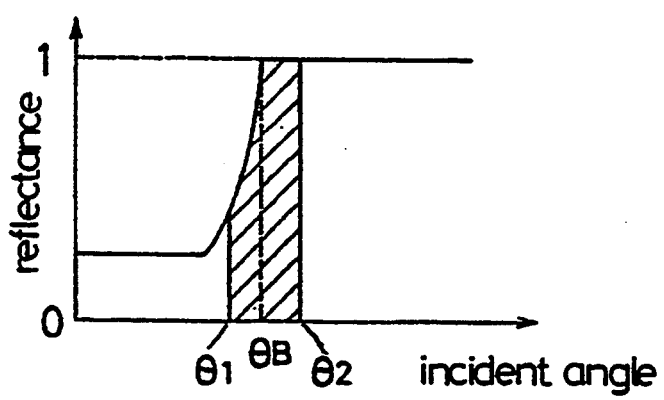
FIGS. 6(a) and 6(b) are diagrams illustrating incident angle vs. reflectance characteristics of signal light incident on a switch.
Figure 6:
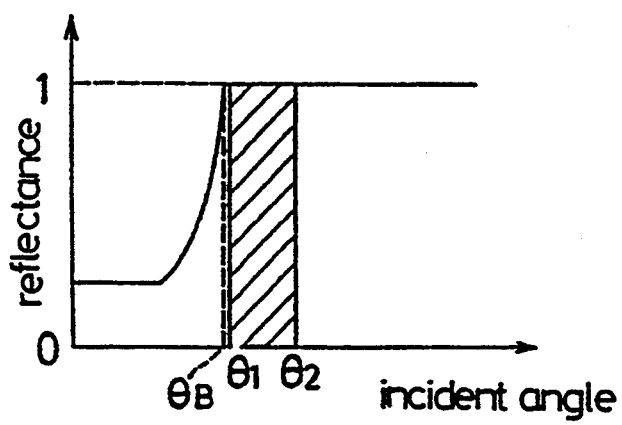

FIGS. 6(a) and 6(b) illustrate incident angle vs. reflectance characteristics of the signal light incident on the switch. In the figures, $\theta B$ denotes an angle of polarization of the total reflection of the signal light at the boundary between the switch and the waveguide, and $\theta 1$ and $\theta 2$ denote the minimum input angle and the maximum input angle of the signal light incident on the switch, respectively. The angle of polarization $\theta B$ is represented as follows:

$$\sin\theta B = \frac{n - \Delta n}{n} \quad (1)$$

where n is the refractive index of the optical waveguide layer of the waveguide and $\Delta n$ is the variation in the refractive index due to the current injection. It is found from the equation (1) that the variation $\Delta n$ in the refractive index increases with a decrease in the energy band gap of the optical waveguide layer, so that the angle of polarization $\theta B$ is reduced with the decrease in the energy band gap of the optical waveguide layer.

When the energy band gap of the optical waveguide layer of the waveguide is large and the angle of polarization $\theta B$ is within a range of the possible incident angle of the signal light on the switch, i.e., $\theta 1 \leq \theta B \leq \theta 2$, as shown in FIG. 6(a), signal light incident on the switch at an angle smaller than the angle of polarization $\theta B$ is not reflected at the switch but crosses the switch. On the other hand, when the energy band gap of the optical waveguide layer of the waveguide is small and the angle of polarization $\theta B$ is smaller than the minimum incident angle $\theta 1$ of the signal light as shown in FIG. 6(b), all of the signal light incident on the switch at angles in the range from $\theta 1$ to $\theta 2$ is totally reflected. That is, from the FIGS. 6(a) and 6(b), it is found that the energy band gap of the optical waveguide layer of the switch region should be reduced to improve the switching characteristic of the switch, i.e., to increase the ON/OFF ratio of the switch.

On the other hand, it is known that the absorption loss of the signal light traveling through the waveguide increases as the energy band gap of the optical waveguide layer of the waveguide is decreased.

Figure 7:
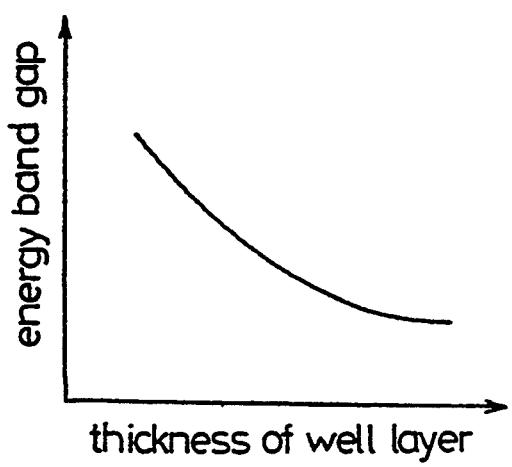
FIG. 7 is a diagram illustrating a relationship between the energy band gap of an MQW layer and thickness of a well layer included in the MQW layer.

FIG. 7 illustrates the relationship between the thickness of the well layer included in the MQW layer and the energy band gap of the MQW layer. As shown in FIG. 7, the energy band gap of the MQW layer decreases as the thickness of the well layer increases.

Accordingly, in this first embodiment of the present invention, as shown in FIGS. 3 and 4, the optical waveguide layers 31 and 31' of the waveguides 2A, 2B, and 2C comprise the MQW layers, and the InGaAsP well layer 31a' of the MQW layer 31' in the part where the waveguide 2A including the switch 30a and the waveguide 2B are connected is thicker than the InGaAsP well layer 31a of the MQW layer 31 in the other part, so that the energy band gap of the MQW layer 31' is smaller than the energy band gap of the MQW layer 31.

A description is given of the production process.

Generally, when a prescribed region of a semiconductor substrate is surrounded with a mask pattern comprising SiO$_2$ or the like and a semiconductor layer is epitaxially grown on the semiconductor substrate with the mask pattern, group-III elements, such as In and Ga, applied to the prescribed region of the substrate where the mask pattern is absent contribute to the growth of the semiconductor layer, but the group-III elements applied to the mask pattern move over the mask pattern to reach the prescribed region surrounded with the mask pattern and contribute to the growth of the semiconductor layer on that region. Therefore, the growth rate of the semiconductor layer on the region of the semiconductor substrate surrounded by the mask pattern is higher than that on the other region of the semiconductor substrate.

Figure 8:
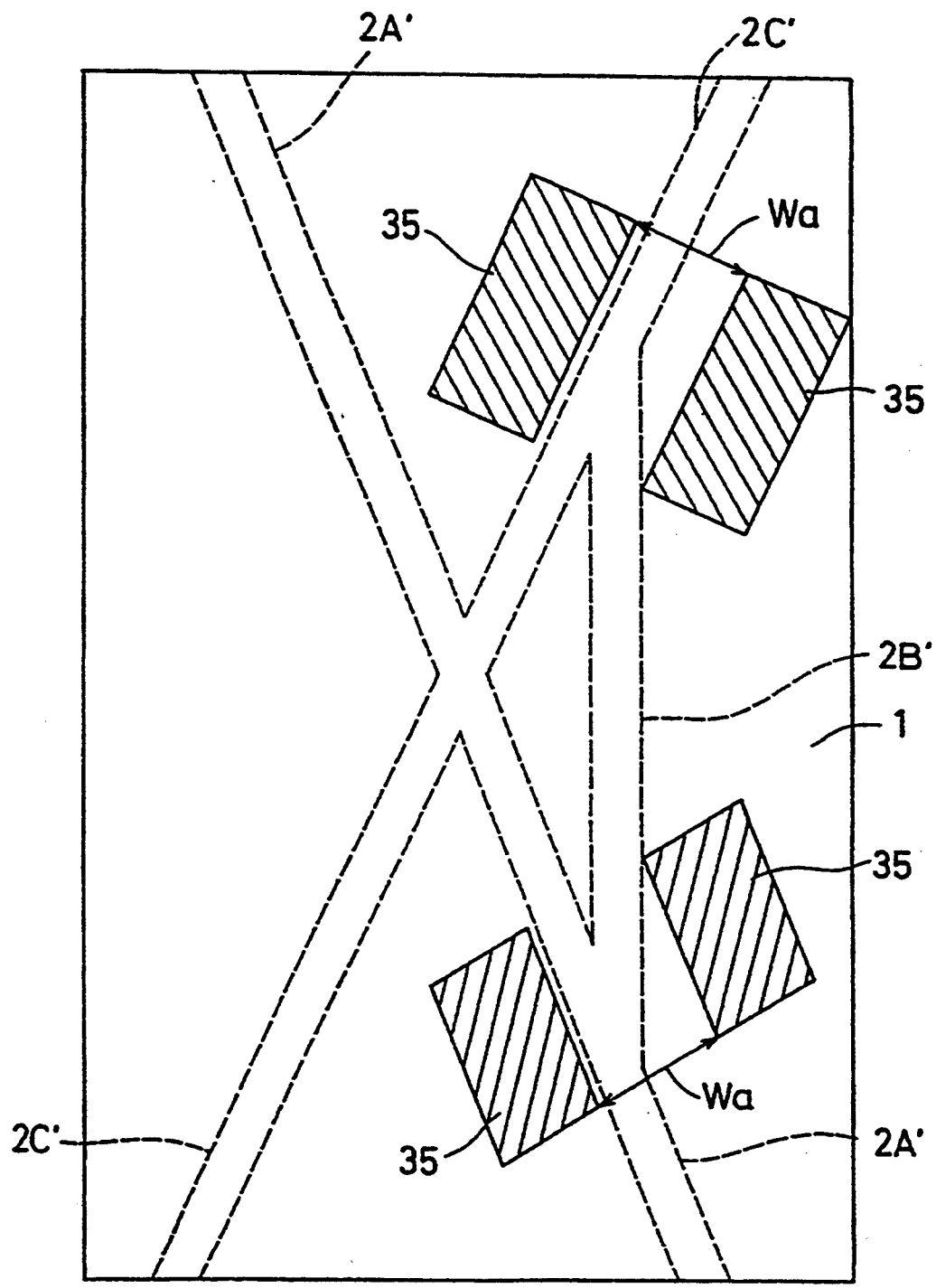
FIG. 8 is a plan view of a semiconductor substrate used for fabricating the optical switch of FIGS. 1 and 2.

Initially, as illustrated in FIG. 8, regions 2A', 2B', and 2C' where the ridge waveguides 2A, 2B, and 2C are to be formed are prescribed on the n type InP substrate 1. Then, portions of the waveguide regions 2A' to 2C' where the switches 30a and 30b are to be formed are sandwiched by SiO$_2$ mask patterns 35 with a prescribed space Wa between opposite mask patterns 35. Then, the n type InP cladding layer 32, the optical waveguide layer 31 (31'), the p type InP cladding layer 9, and the p type InGaAsP contact layer 10 are epitaxially grown on the n type InP substrate 1, preferably by MOCVD. During the epitaxial growth, the growth rate on the region of the n type InP substrate sandwiched by the mask patterns 35 is higher than the growth rate on the other region, so that the thicknesses of the respective semiconductor layers grown on that region sandwiched by the mask patterns 35 are larger than the thicknesses of the semiconductor layers grown on the other region. After removing the mask patterns 35, the semiconductor layers grown on regions other than the waveguide regions 2A', 2B', and 2C' are selectively etched away to form the ridge waveguides 2A, 2B, and 2C. Thereafter, an SiO$_2$ insulating film 11 is formed on the entire surface of the substrate, and portions of the insulating film 11 opposite the regions where the switches 30a and 30b are to be formed are removed to expose the surface of the p type InGaAsP contact layer 10. Then, electrodes 8 comprising Au/Zn/Ni are formed on the exposed surface of the contact layer 10 and an electrode 15 comprising Cr/Au is formed on the rear surface of the substrate 1, completing the optical switch 100 of FIG. 1.

In the optical switch according to the first embodiment of the present invention, the energy band gaps of the optical waveguide layers 31 and 31' (1.05 eV and 0.98 eV, respectively) are larger than the energy of the signal light (0.95 eV). In addition, the energy band gap of the optical waveguide layer 31' of the switch (0.98 eV) is smaller than the energy band gap of the optical waveguide layer 31 of the waveguide (1.05 eV), and the absorption loss of the signal light traveling through the optical waveguide layer is reduced. In addition, the change in the refractive index of the optical waveguide layer 31' included in the switch 30a (30b) is increased during the current injection, whereby the ON/OFF ratio of the switch is increased. Further, since the semiconductor layers included in the switches 30a and 30b and the semiconductor layers included in the waveguides 2A, 2B and 2C are grown simultaneously in the same process, transmission loss of the signal light at the boundary between the switch and the waveguide is avoided, and production is simplified.

Figure 9:
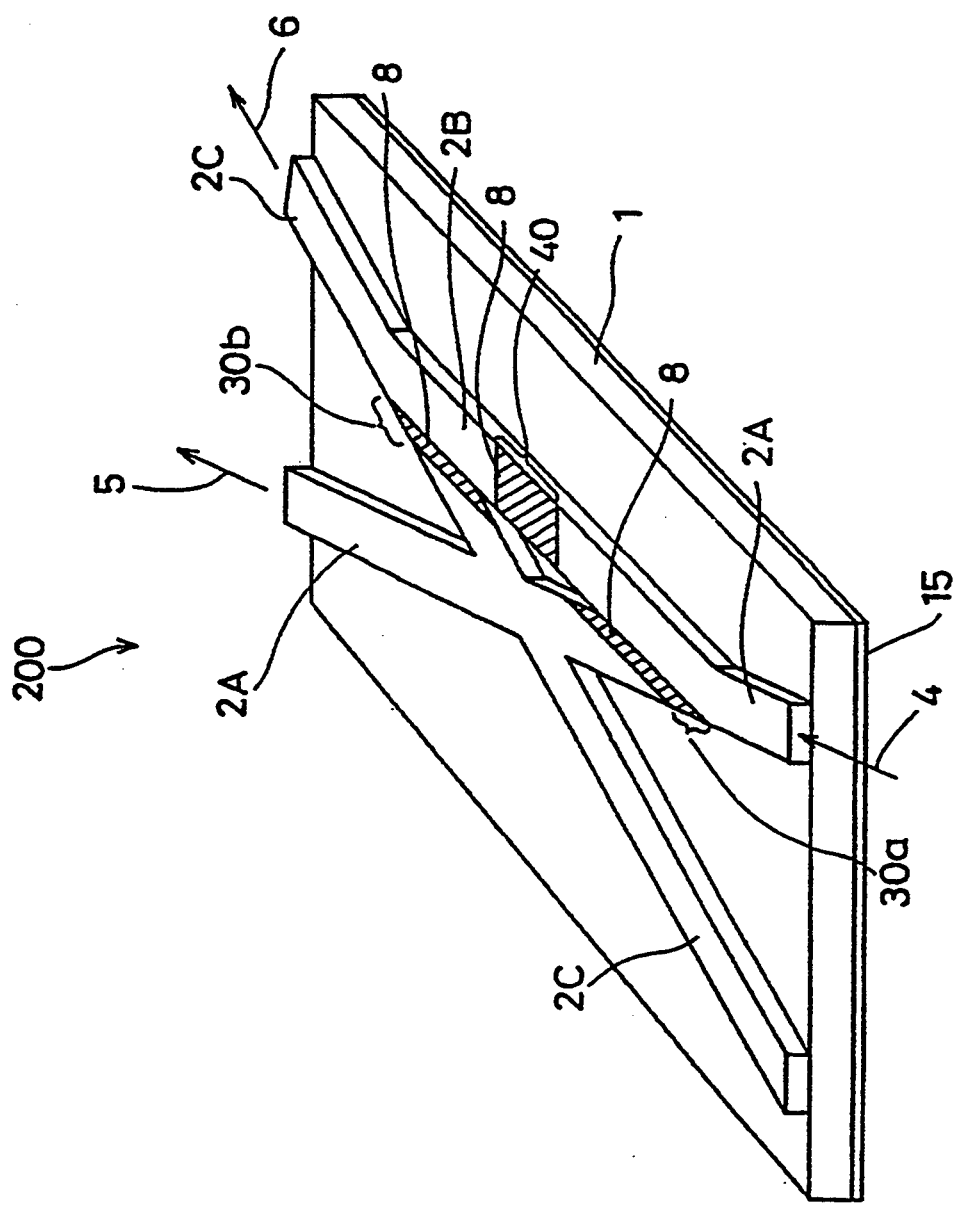
FIG. 9 is a perspective view illustrating an optical switch in accordance with a second embodiment of the present invention.
Figure 10:
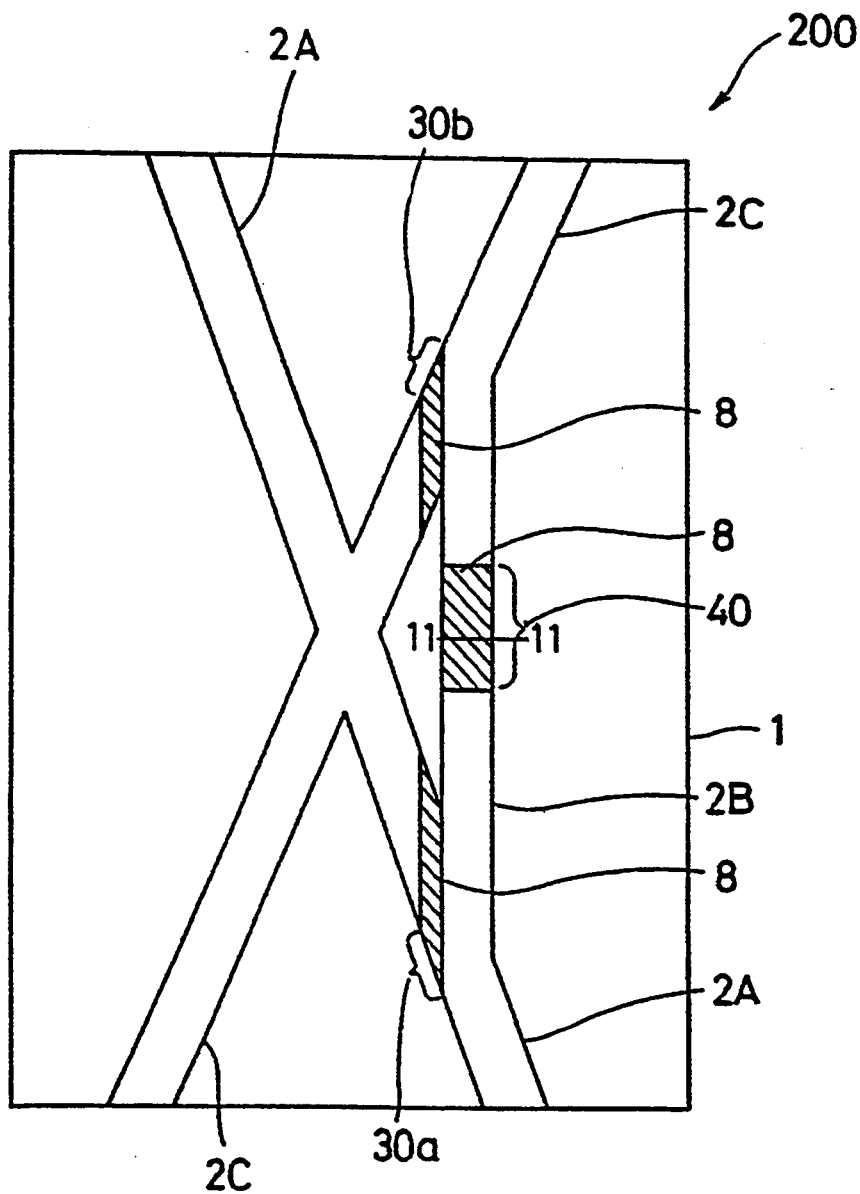
FIG. 10 is a plan view of the optical switch of FIG. 9.

FIGS. 9 and 10 are a perspective view and a plan view, respectively, schematically illustrating an optical switch in which signal light having an energy of 0.95 eV corresponding to a wavelength of 1.3 μm travels, all in accordance with a second embodiment of the present invention. In the figures, the same reference numerals as in FIGS. 1 and 2 designate the same or corresponding parts. The optical switch 200 of this second embodiment is identical to the optical switch 100 of the first embodiment except that an optical amplifier 40 is disposed in a part of the waveguide 2B.

Figure 11:
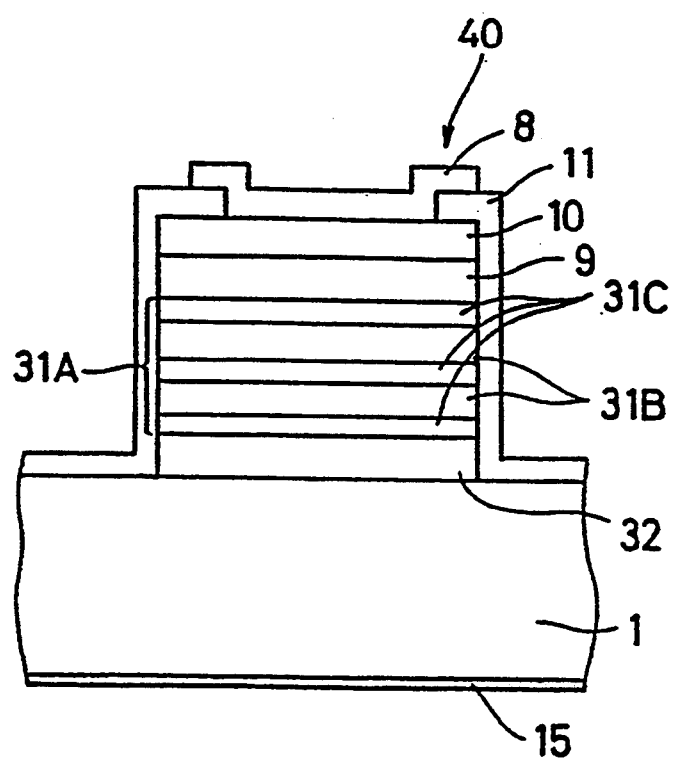
FIG. 11 is a sectional view taken along line 11—11 of FIG. 10.

FIG. 11 is a sectional view taken along line 11—11 of FIG. 10, illustrating an internal structure of the optical amplifier 40. The optical amplifier 40 comprises an n type InP lower cladding layer 32 disposed on the n type InP substrate 1, an optical waveguide layer 31A having an MQW structure disposed on the lower cladding layer 32, a p type InP upper cladding layer 9 disposed on the waveguide layer 31A, a p type InGaAsP contact layer 10 disposed on the upper cladding layer 9, and an electrode 8a. The thickness of the MQW optical waveguide layer 31A is larger than the thickness of the MQW optical waveguide layer 31' of the switch 30a (30b) included in the waveguide 2A (2C), so that the energy band gap of the optical waveguide layer 31A is smaller than the energy (0.95 eV) of the signal light. More specifically, the MQW optical waveguide layer 31A comprises two InGaAsP well layers 31B each having a thickness of 80 Å that is larger than the InGaAsP well layer 31a' of FIG. 4 and three InP or InGaAsP barrier layers 31C each having a thickness of 350 Å that is larger than the InP or InGaAsP barrier layer 31b' of FIG. 4.

A description is given of the production process.

Figure 12:
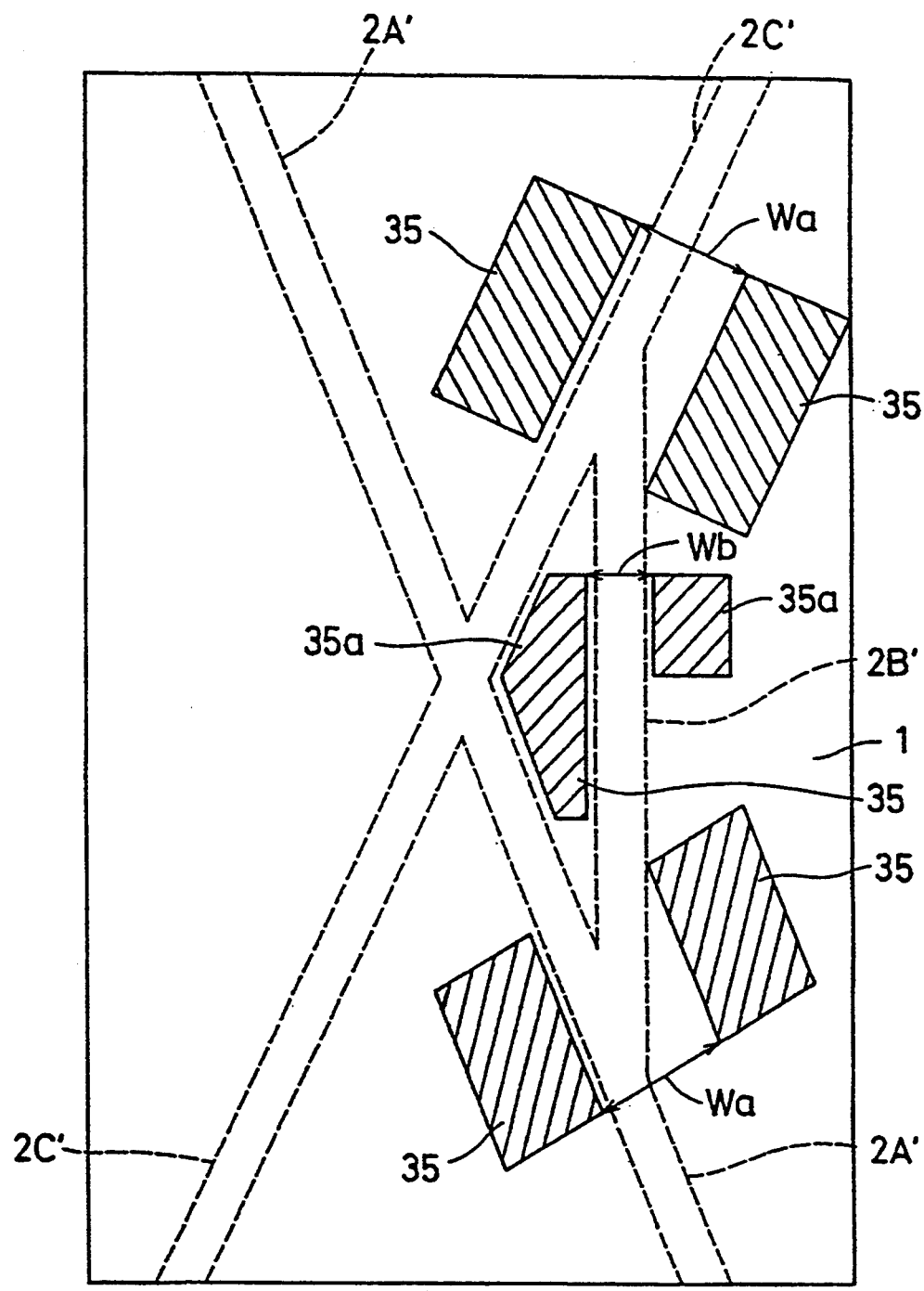
FIG. 12 is a plan view of a semiconductor substrate used for fabricating the optical switch of FIGS. 9 and 10.

FIG. 12 is a plan view illustrating a step in the production process of the optical switch 200. In the figure, the same reference numerals as in FIG. 8 designate the same or corresponding parts. The production of the optical switch 200 is fundamentally identical to the production of the optical switch 100 shown in FIG. 8. When the mask patterns 35 are formed on the surface of the n type InP substrate 1, mask patterns 35a are formed on opposite sides of the waveguide region 2B' where the optical amplifier is to be formed. The space Wb between the mask patterns 35a is narrower than the space Wa between the mask patterns 35 sandwiching the region where the switch is to be formed. Thereafter, the respective semiconductor layers are epitaxially grown. The electrode 8a of the optical amplifier 40 is formed simultaneously with the electrodes 8 of the switches 30a and 30b.

In the optical switch 200 according to this second embodiment, the same effects as described in the first embodiment are attained. In addition, since the InGaAsP well layer 31B included in the optical waveguide layer 31A of the optical amplifier 40 is thicker than the InGaAsP well layer 31a' included in the optical waveguide layer 31' of the switch 30a (30b), the energy band gap of the waveguide layer 31A is smaller than the energy of the signal light. Therefore, when current is injected into the optical amplifier 40 from the electrode 8a, signal light passing through the amplifier 40 is amplified with high efficiency, whereby the optical amplifier 40 compensates for absorption loss of the signal light traveling through the optical waveguide layer. In addition, since the optical amplifier 40 and the waveguide 2B comprise the same semiconductor layers formed in the same process, transmission loss of the signal light at the boundary between the amplifier 40 and the waveguide 2B is avoided. Further, since the waveguides 2A, 2B, and 2C and the optical amplifier 40 are simultaneously formed, production is simplified.

Figure 13:
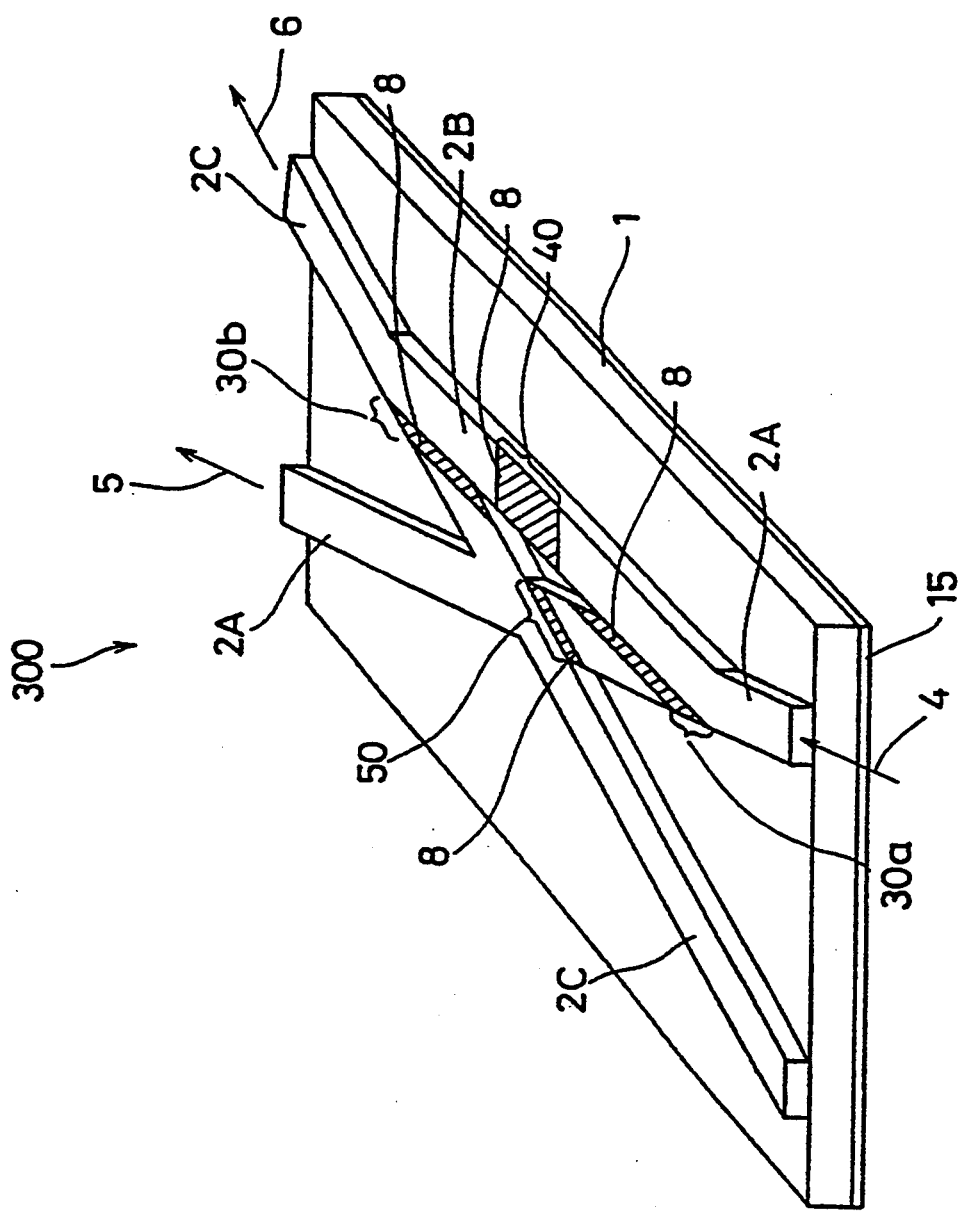
FIG. 13 is a perspective view illustrating an optical switch in accordance with a third embodiment of the present invention.
Figure 14:
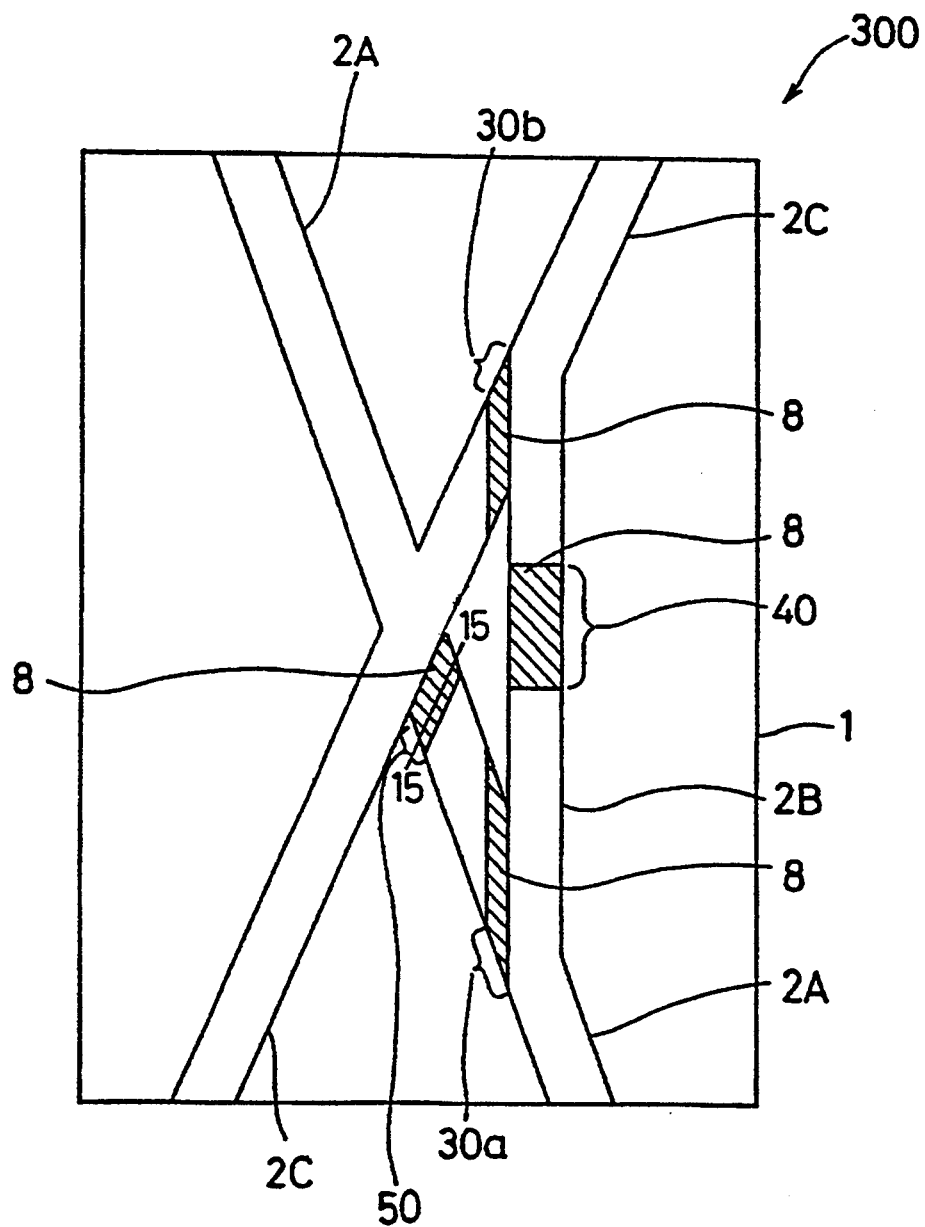
FIG. 14 is a plan view of the optical switch of FIG. 13.

FIGS. 13 and 14 are a perspective view and a plan view, respectively, schematically illustrating an optical switch in which signal light having an energy of 0.95 eV corresponding to a wavelength of 1.3 μm travels, all in accordance with a third embodiment of the present invention. In the figures, the same reference numerals as those in FIGS. 1 and 2 designate the same or corresponding parts. This optical switch 300 is fundamentally identical to the optical switch 200 of the second embodiment except that an optical absorption part 50 is disposed in the waveguide 2A.

Figure 15:
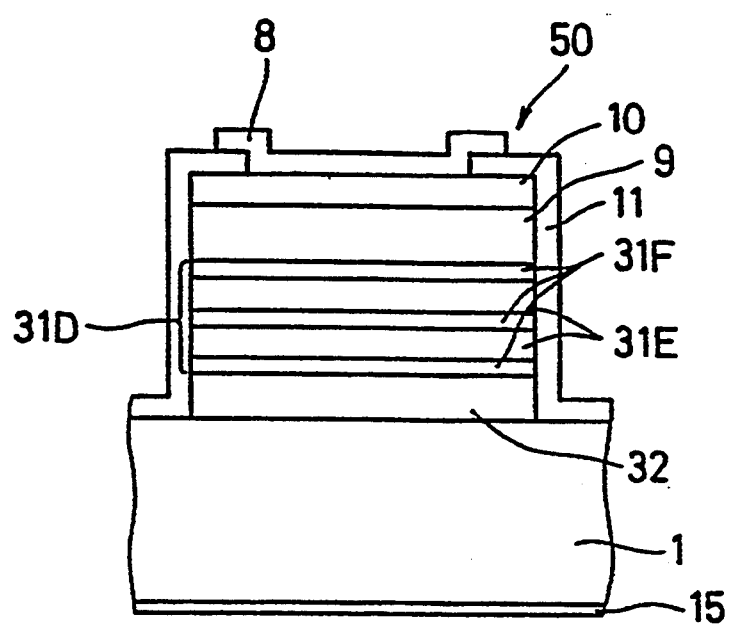
FIG. 15 is a sectional view taken along line 15—15 of FIG. 14.

FIG. 15 is a sectional view taken along line 15—15 of FIG. 14, illustrating the internal structure of the optical absorption part 50. The optical absorption part 50 comprises an n type InP lower cladding layer 32 disposed on the n type InP substrate 1, an optical waveguide layer 31D having an MQW structure disposed on the lower cladding layer 32, a p type InP upper cladding layer 9 disposed on the waveguide layer 31D, a p type InGaAsP contact layer 10 disposed on the upper cladding layer 9, and an electrode 8b disposed on the contact layer 10. The thickness of the optical waveguide layer 31D is the same as the thickness of the optical waveguide layer 31' of the switch 30a (30b) included in the waveguide 2A (2C), whereby the energy band gap of the optical waveguide layer 31D is the same as the energy band gap of the optical waveguide layer 31'. More specifically, the optical waveguide layer 31D having an MQW structure comprises two InGaAsP well layers 31E, each having a thickness of 70 Å, that is equal to the thickness of the InGaAsP well layer 31a' of FIG. 4 and three InP or InGaAsP barrier layers 31F, each having a thickness of 300 Å, that is equal to the thickness of the InP or InGaAsP barrier layer 31b' of FIG. 4.

A description is given of the production process.

Figure 16:
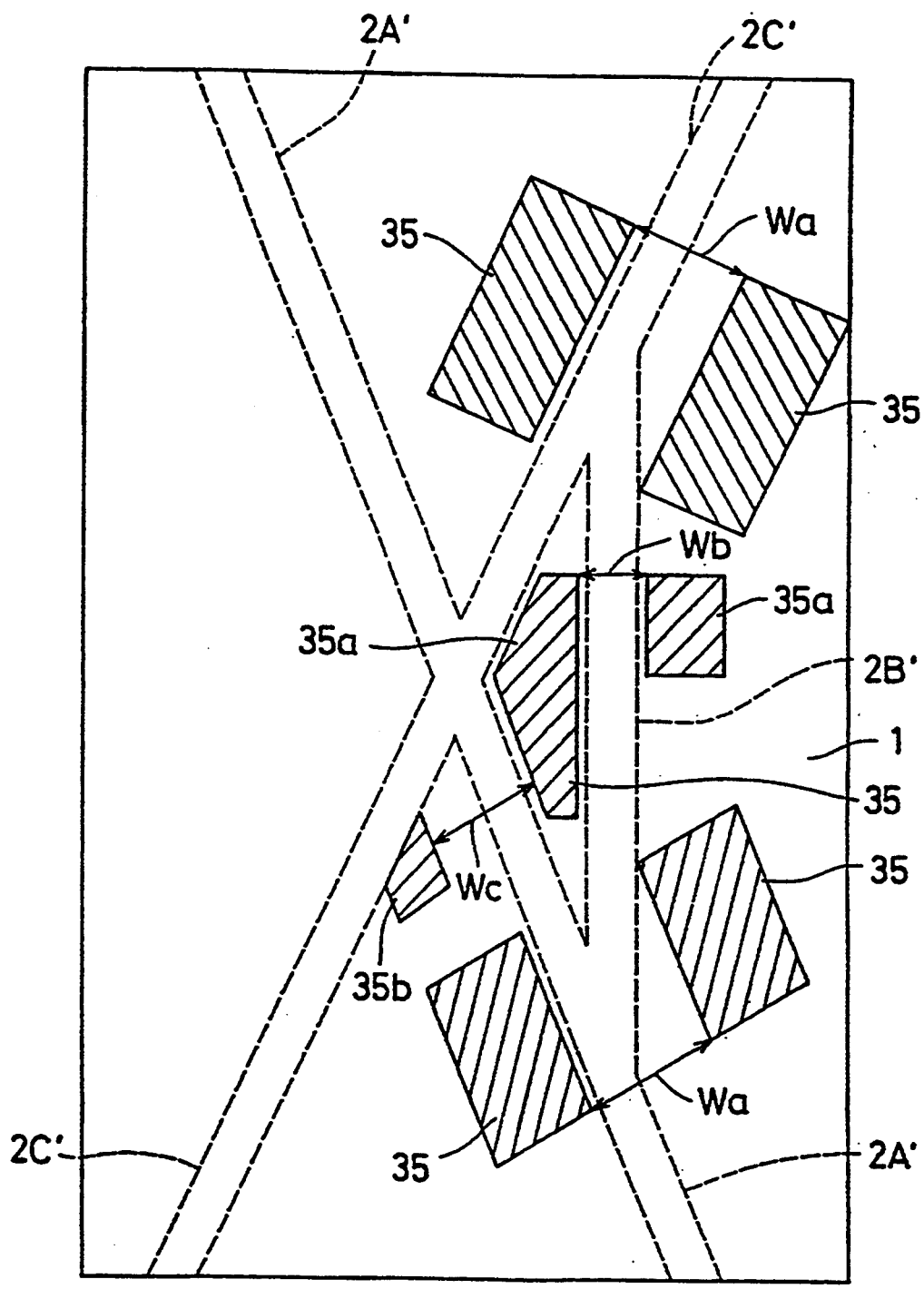
FIG. 16 is a plan view illustrating a semiconductor substrate used for fabricating the optical switch shown in FIGS. 13 and 14.

FIG. 16 is a plan view illustrating a step in the production process of the optical switch 300. In the figure, the same reference numerals as in FIG. 12 designate the same or corresponding parts. The production of the optical switch 300 is fundamentally identical to the production of the optical switch 200 shown in FIG. 12. When the mask patterns 35 and 35a are formed on the surface of the n type InP substrate 1, a mask pattern 35b is formed on the opposite side of the waveguide region 2A' from the mask pattern 35a so that a portion of the waveguide region 2A' where the optical absorption part 50 is to be formed is sandwiched between the mask patterns 35b and 35a. The space Wc between the mask patterns 35a and 35b is the same as the space Wa between the mask patterns 35. Thereafter, the respective semiconductor layers are epitaxially grown. The electrode 8b of the optical absorption part 50 is formed simultaneously with the electrodes 8 of the switches 30a and 30b and the electrode 8b of the optical amplifier 40.

A description is given of the operation.

In FIG. 13, when current is injected into the switches 30a and 30b from the electrodes 8, signal light 4 enters the waveguide 2A, travels through the waveguide 2B, and exits at the waveguide 2C as output light 6. However, to be exact, a part of the signal light 4 is not reflected at the switch 30a but crosses the switch 30a.

Figure 17:
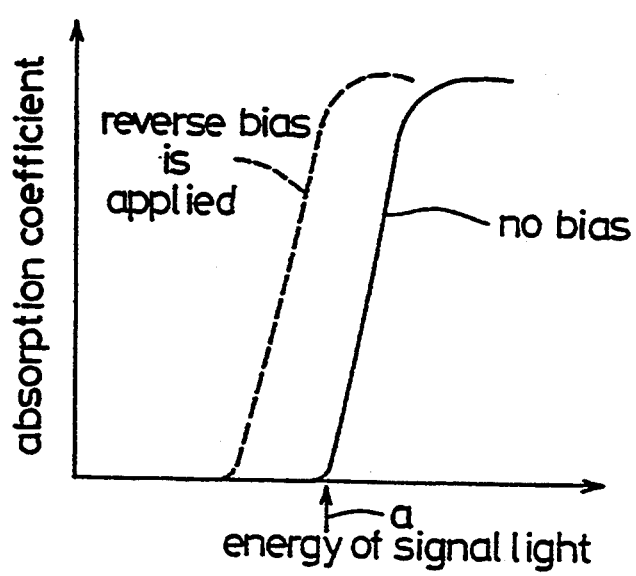
FIG. 17 is a diagram illustrating variations in absorption spectrum of an optical waveguide layer 31D shown in FIG. 15.

As described above, the thickness of the InGaAsP well layer 31E included in the optical waveguide layer 31D of the optical absorption part 50 is selected so that the optical waveguide layer 31D has an energy band gap larger than the energy of the signal light. When a reverse bias is applied to the optical absorption part 50 from the electrodes 8 and 15, the absorption spectrum of the optical waveguide layer 31D varies due to the quantum confinement Stark effect. FIG. 17 illustrates variations in the absorption spectrum of the optical waveguide layer 31D. In the figure, the arrow "a" shows the energy of the signal light. When no bias is applied to the optical absorption part 50, the signal light crosses the absorption part 50. When a reverse bias is applied to the absorption part 50, the signal light is absorbed by the absorption part 50. In this way, the signal light that is not reflected at the switch but crosses the switch is absorbed by the absorption part 50 when reverse bias is applied to the absorption part.

In the optical switch 300 according to the third embodiment of the present invention, the same effects as in the above-described second embodiment are attained. In addition, since the thickness of the InGaAsP well layer 31E included in the optical waveguide layer 31D of the optical absorption part 50 is the same as the thickness of the InGaAsP well layer 31a' included in the optical waveguide layer 31' of the switch 30a, the energy band gap of the optical waveguide layer 31D is larger than the energy of the signal light. Therefore, when a reverse bias is applied to the absorption part 50, the absorption spectrum varies due to the quantum confinement Stark effect, and the light passing through the switch 30a is absorbed by the absorption part 50, resulting in a further increase in switching precision.

While in the above-described first to third embodiments optical switches employing InP and InGaAsP compound semiconductors are described, the same effects as described above are achieved even if GaAs and AlGaAs compound semiconductors are employed.

What is claimed is:

1. An optical switch comprising:
    a semiconductor substrate having a surface;
    a ridge waveguide disposed on the surface of said semiconductor substrate and comprising at least an optical waveguide layer and first and second cladding layers sandwiching said optical waveguide layer, said optical waveguide layer having a multiquantum well structure; and
    a switch disposed in part of said ridge waveguide and having a refractive index reduced by current injection, thereby interrupting signal light having an energy and traveling in said ridge waveguide, wherein a first part of said optical waveguide layer included in said switch is thicker and has a smaller energy band gap than a second part of said optical waveguide layer not included in said switch, the energy band gap of said first part of said optical waveguide layer included in said switch being larger than the energy of the signal light.

2. The optical switch of claim 1 wherein said optical waveguide layer having a multiquantum well structure comprises alternating well layers of one of InGaAs and InGaAsP and barrier layers of one of InP and InGaAsP and said first and second cladding layers are InP.

3. An optical switch comprising:
    a semiconductor substrate having a surface;
    a ridge waveguide disposed on the surface of said semiconductor substrate and comprising at least an optical waveguide layer and first and second cladding layers sandwiching said optical waveguide layer, said optical waveguide layer having a multiquantum well structure;
    a switch disposed in part of said ridge waveguide and having a refractive index reduced by current injection, thereby interrupting signal light having an energy and traveling in said ridge waveguide, wherein a first part of said optical waveguide layer included in said switch is thicker and has a smaller energy band gap than a second part of said optical waveguide layer not included in said switch, the energy band gap of said first part of said optical waveguide layer included in said switch being larger than the energy of the signal light; and
    an optical amplifier for amplifying the signal light by current injection, said optical amplifier being disposed in a part of said ridge waveguide, wherein a third part of said optical waveguide layer included in said optical amplifier is thicker than said first part of said optical waveguide layer included in said switch and the energy band gap of said third part of said optical waveguide layer included in said optical amplifier is smaller than the energy band gap of said first part of said optical waveguide layer included in said switch and smaller than the energy of the signal light.

4. The optical switch of claim 3 wherein said optical waveguide layer having a multiquantum well structure comprises alternating well layers of one of InGaAs and InGaAsP and barrier layers of one of InP and InGaAsP and said first and second cladding layers are InP.

5. An optical switch comprising:
    a semiconductor substrate having a surface;
    a ridge waveguide disposed on the surface of said semiconductor substrate and comprising at least an optical waveguide layer and first and second cladding layers sandwiching said optical waveguide layer, said optical waveguide layer having a multiquantum well structure;
    a switch disposed in part of said ridge waveguide and having a refractive index reduced by current injection, thereby interrupting signal light having an energy and traveling in said ridge waveguide; and
    a light absorption part for absorbing part of the signal light passing through said switch upon application of a voltage, said light absorption part being disposed in said ridge waveguide in the vicinity of said switch, wherein parts of said optical waveguide layer included in said switch and in said light absorption part are thicker than other parts of said optical waveguide layer and have an energy band gap smaller than the energy band gap of other parts of said optical waveguide layer and larger than the energy of the signal light.

6. The optical switch of claim 5 wherein said optical waveguide layer having a multiquantum well structure comprises alternating InGaAsP well layers and barrier layers of one of InP and InGaAsP and said first and second cladding layers are InP.

7. A method for producing an optical switch including a waveguide through which signal light travels and a switch for interrupting passage of the signal light disposed in a part of said waveguide, said method comprising:
    forming spaced apart insulating films on a front surface of a semiconductor substrate so that a region where a switch is to be formed is sandwiched by said insulating films;
    growing a first cladding layer on said semiconductor substrate;

growing an optical waveguide layer having a multiquantum well structure on said first cladding layer so that a part of said optical waveguide layer grown on said region where said switch is to be formed is thicker than said optical waveguide layer grown elsewhere, has a smaller energy band gap than said optical waveguide layer grown elsewhere, and has an energy band gap larger than the energy of the signal light;

growing a second cladding layer on said optical waveguide layer;

patterning said first cladding layer, said optical waveguide layer, and said second cladding layer to form a ridge waveguide structure; and forming electrodes on a rear surface of said semiconductor substrate and on a part of said ridge waveguide structure to complete said switch.

8. A method for producing an optical switch including a waveguide through which signal light travels, a switch for interrupting passage of the signal light disposed in a part of said waveguide, and an optical amplifier for amplifying the signal light disposed in a part of said waveguide, said method comprising:

forming first insulating films on a front surface of a semiconductor substrate with a first space so that a region where a switch is to be formed is sandwiched by said first insulating films, and forming second insulating films on the surface of said semiconductor substrate with a second space narrower than the first space so that a region where said optical amplifier is to be formed is sandwiched by said second insulating films;

growing a first cladding layer on the surface of said semiconductor substrate;

growing an optical waveguide layer having a multiquantum well structure on said first cladding layer so that a part of said optical waveguide layer grown on said region where said switch is to be formed is thicker, has a smaller energy band gap than other parts of said optical waveguide layer, and has an energy band gap larger than the energy of the signal light and a part of said optical waveguide layer grown on said region where said optical amplifier is to be formed is thicker than said optical waveguide layer grown on said region where said switch is to be formed, has an energy band gap smaller than the part of said optical waveguide layer grown on said region where said switch is to be formed, and has an energy band gap smaller than the energy of the signal light;

growing a second cladding layer on said optical waveguide layer;

patterning said first cladding layer, said optical waveguide layer, and said second cladding layer to form a ridge waveguide structure; and forming electrodes on a rear surface of said semiconductor substrate and on a part of said ridge waveguide structure to complete said switch and said optical amplifier.

9. A method for producing an optical switch including a waveguide through which signal light travels, a switch for interrupting passage of the signal light disposed in a part of said waveguide, and a light absorption part for absorbing the signal light disposed in a part of said waveguide in the vicinity of said switch, said method comprising:

forming spaced apart insulating films on a front surface of a semiconductor substrate so that a region where a switch is to be formed and a region where said light absorption part is to be formed are respectively sandwiched by said insulating films;

growing a first cladding layer on the surface of said semiconductor substrate;

growing an optical waveguide layer having a multiquantum well structure on said first cladding layer so that the parts of said optical waveguide layer grown on said regions where said switch and said light absorption part are to be formed are thicker than other parts of said optical waveguide layer and have energy band gaps smaller than the energy band gaps of other parts of said optical waveguide layer and larger than the energy of the signal light;

growing a second cladding layer on said optical waveguide layer;

patterning said first cladding layer, said optical waveguide layer, and said second cladding layer to form a ridge waveguide structure; and forming electrodes on a rear surface of said semiconductor substrate and on a part of said ridge waveguide structure to complete said switch and said light absorption layer.

* * * * *